Figure 1:
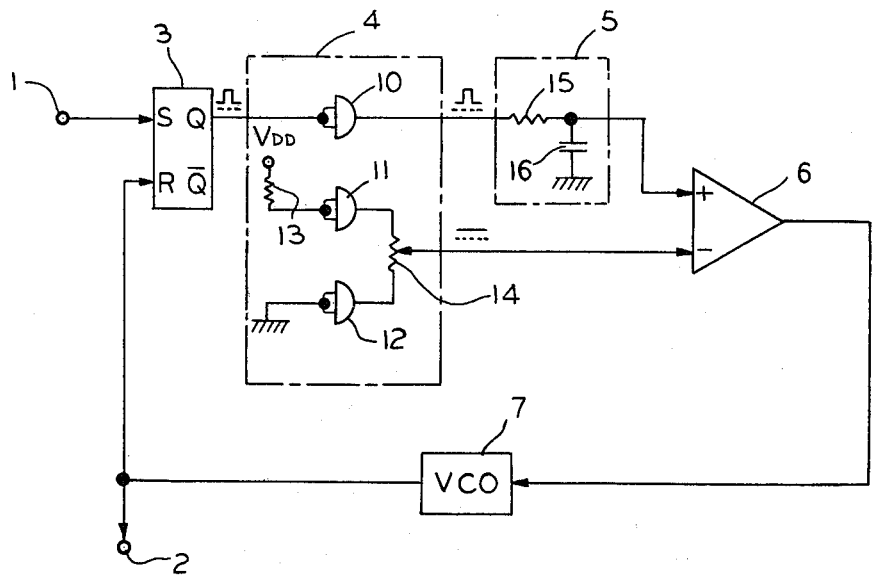

United States Patent [19]

Futatsuishi

[11] 4,389,621
[45] Jun. 21, 1983

[54] PHASE LOCKED LOOP STABILIZED AGAINST TEMPERATURE AND VOLTAGE VARIATIONS

[75] Inventor: Godo Futatsuishi, Tokyo, Japan

[73] Assignee: Nippon Electric Co., Ltd., Tokyo, Japan

[21] Appl. No.: 213,235

[22] Filed: Dec. 5, 1980

Related U.S. Application Data

[63] Continuation of Ser. No. 45,944, Jun. 6, 1979, abandoned.

[30] Foreign Application Priority Data

Jun. 15, 1978 [JP] Japan .................................. 53/82785

[51] Int. Cl.³ .............................................. H03L 7/08
[52] U.S. Cl. ....................................... 331/1 A; 331/25
[58] Field of Search ...................... 331/1 A, 17, 18, 25, 331/27; 360/51

[56] References Cited

U.S. PATENT DOCUMENTS

| | | | |
|---|---|---|---|
| 3,815,042 | 6/1974 | Maunsell et al. | 331/1 A X |
| 3,944,940 | 3/1976 | Desai | 360/51 X |
| 4,055,814 | 10/1977 | Abraham et al. | 331/1 A |
| 4,155,050 | 5/1979 | Nichols | 331/1 A X |
| 4,163,951 | 8/1979 | Aihara et al. | 331/1 A |

OTHER PUBLICATIONS

Phase-Locked Loop Data Book, Motorola, Aug. 1973, pp. 1-17.
"11C44 Phase/Frequency Detector-11C00 Series," Fairchild Catalogue, Mar. 1975, pp. 1-5.
C. J. Byrne, "Properties and Design of the Phase-Controlled Oscillator with a Sawtooth Comparator," B.S.T.J., Mar. 1962, pp. 559-562.

Primary Examiner—Siegfried H. Grimm
Assistant Examiner—Edward P. Westin
Attorney, Agent, or Firm—Laff, Whitesel, Conte & Saret

[57] ABSTRACT

A phase-locked loop circuit uses a voltage control oscillator which varies its frequency in response to a certain control signal. A first logic circuit generates pulses having pulse widths that are proportional to the phase differences between applied input pulses and the pulses from the oscillator. The output of the first logic circuit is filtered. Second and third logic circuits are used for generating high and low d.c. levels, respectively. The output levels of the second and third logic circuits are combined into a predetermined synthesized d.c. level. The control signal is generated, corresponding to the level difference between the outputs of the filtering means and the synthesized d.c. level.

4 Claims, 2 Drawing Figures

PHASE LOCKED LOOP STABILIZED AGAINST TEMPERATURE AND VOLTAGE VARIATIONS

This is a continuation of application Ser. No. 045,944, filed June 6, 1979 and now abandoned.

The present invention relates to phase-locked loop ("PLL") circuits and, in particular, to high stability digital PLL circuits.

This type of conventional PLL circuits include a voltage-controlled oscillator, a digital phase comparator for detecting a phase difference between input pulses applied to these PLL circuits and for producing detection pulses having pulse widths which are proportional to this phase difference, and a low-pass filter for integrating these detection pulses to control the oscillator. Further, since this digital phase comparator generally uses integrated logic circuits, the high and low voltage levels of its output pulses vary greatly, depending on temperature. For instance, they may vary a few hundred millivolts in a temperature range of $-20°$ C. to $+60°$ C. These high and low levels may also vary with any variations in power supply voltage. The output frequency of the oscillator also varies with the variation in these voltage levels. Therefore, at times, the frequency range in which the phase-locking is achievable deviates and tends to be narrowed to the extent that phase-locking is impossible.

With respect to conventional PLL circuits, reference is made to the following disclosure:

1. *Phase-Locked Loop Data Book*, Motorola, August 1973, pp. 1–17;
2. "11C44 PHASE/FREQUENCY DETECTOR-11C00 Series," Fairchild Catalogue, March 1975, pp. 1–5; and
3. C. J. Byrne "Properties and Design of the Phase-Controlled Oscillator with a Sawtooth Comparator," B.S.T.J., pp. 559–602, March 1962.
4. U.S. Pat. Nos. 4,155,050 and 3,815,042.

An object of the present invention is to provide PLL circuits which are stabilized against temperature and power supply-related variations.

According to an aspect of the present invention, a phase-locked loop circuit uses a voltage control oscillating means which varies its oscillating frequency in response to a certain control signal. A first logic means generates pulses having pulse widths that are proportional to the phase differences between applied input pulses and the pulses from the oscillating means. The output of the first logic means is filtered. Second and third logic means are used for generating high and low d.c. levels respectively. The output levels of the second and third logic means are combined to convert them into a predetermined synthesized d.c. level. The control signal is generated, corresponding to the level difference between the outputs of the filtering means and the combined levels.

According to another aspect of the present invention, a phase-locked loop circuit comprises a voltage control oscillating means which varies its oscillating frequency in response to a certain control signal. A logic means generates complementary logic pulses having pulse widths which are proportional to the phase differences between the applied input pulses and the output pulses of the oscillating means. A first and second means filters the complementary pulses, respectively. The control signal is generated to correspond to the differences between the output levels of the first and second means.

Figure 2:
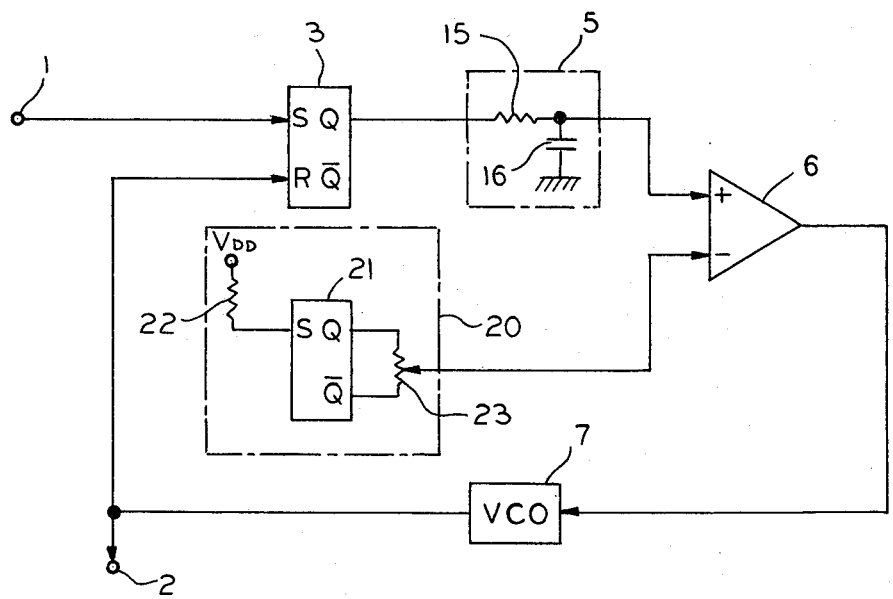
Figure 3:
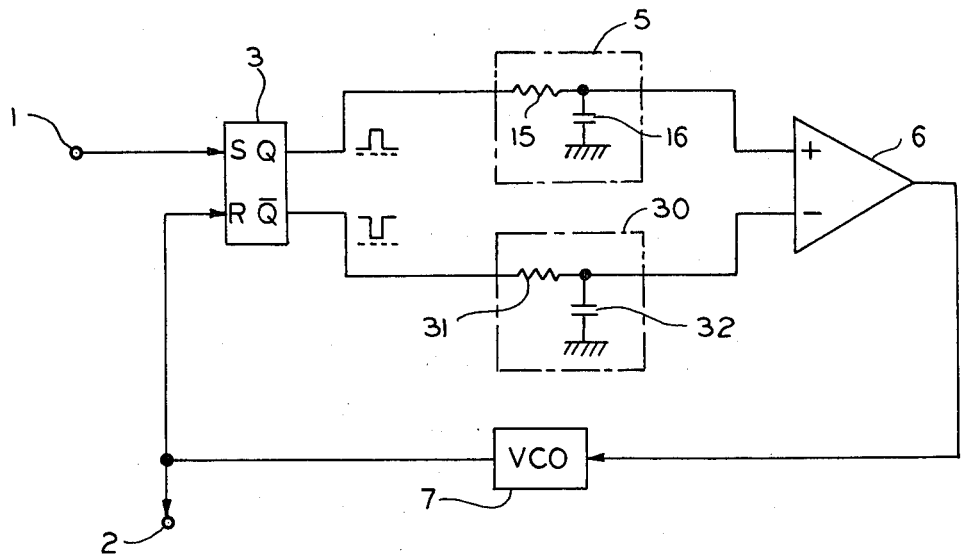
Figure 4:
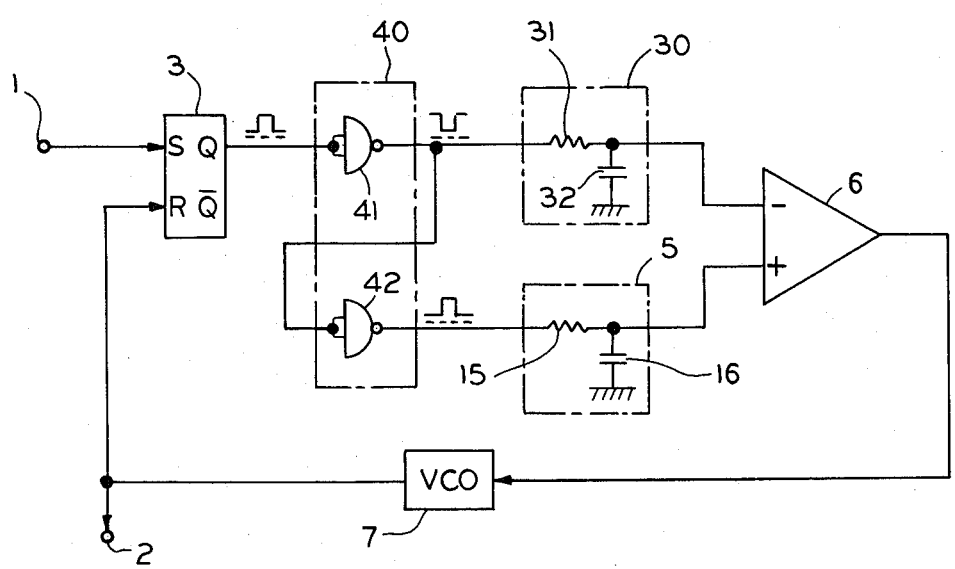

The invention will now be described in more detail with reference to the drawings, in which:

FIG. 1 is an embodiment of a PLL circuit, to which the present invention may be applied; and FIG. 2 is a simplified form of the circuit shown in FIG. 1.

In FIG. 1, input pulses applied to terminal 1 and output pulses of a voltage control oscillator (VCO) 7 are supplied to a digital phase comparator (for example, an S-R-type flip-flop) 3. At the output terminal Q of the comparator 3, detection pulses appear with pulse widths which are proportional to the phase differences between these two pulses. These detection pulses are supplied to an AND gate 10 in a logic circuit 4. The output pulse of the AND gate 10 is converted into an approximate d.c. signal in a low-pass filter 5 (comprising a resistor 15 and a capacitor 16). The resulting signal is supplied to the non-inverted input of a differential amplifier 6.

A power supply voltage $V_{DD}$ is supplied through a resistor 13 to the input of an AND gate 11, and a ground voltage is supplied to the input of an AND gate 12. The d.c. logic "1" and "0" levels appear in the outputs of the AND gates 11 and 12, respectively. Resistor 14 combines these logic levels and supplies a synthesized reference d.c. voltage to the inverted input of the amplifier 6. This d.c. reference voltage is set to be either equal to or substantially equal to the d.c. voltage applied to the non-inverted input of the amplifier 6, in the normal state (that is, after the phase synchronism is restored). During the period while the phase synchronizing is being restored, a d.c. voltage appears at the output of the amplifier 6, which voltage is proportional to the phase difference between the pulses at the terminals 1 and 2. This d.c. voltage controls and synchronizes the VCO 7.

In these circuits, the logic "1" and "0" levels in the outputs of the comparator 3 and the AND gates 10 to 12 may change responsive to temperature variations, thereby changing the d.c. components of the output of the low-pass filter 5. The temperature variation in the output levels of the AND gates 10 to 12, which have the same construction, is approximately equal. Accordingly, a voltage can be obtained from the resistor 14 which is equal to the d.c. variation in the output of the filter 5. This voltage is applied to the inverted input of the amplifier 6. Therefore, in the amplifier 6, temperature-caused d.c. fluctuations are mutually cancelled and the output level of amplifier 6 does not fluctuate responsive to temperature changes. The output levels of the AND gates 10 to 12 also vary responsive to the power supply voltage variations, and this variation can also be cancelled, as in the case of the aforementioned temperature variation.

In FIG. 2, the output of the phase comparator (an S-R-type flip-flop) 3 is supplied through the filter 5 to the non-inverted input of the amplifier 6. The logic circuit 20 comprises an S-R-type flip-flop 21 and resistors 22 and 23. A power supply voltage $V_{DD}$ is supplied through the resistor 22 to the S terminal of this flip-flop 21. Consequently, logic "1" and "0" levels appear at the outputs Q and Q̄ of the flip-flop 21, respectively. As aforementioned, these logic levels are level-converted by the resistor 23 and are supplied as a synthesized reference signal to the inverted input of the amplifier 6. The other operation and effect in FIG. 2 are essentially the same as those shown in FIG. 1.

As stated, the PLL circuits of this invention operate extremely stably, against temperature variation and power supply voltage fluctuations.

Those who are skilled in the art will readily perceive how to modify the system. Therefore, the appended claims are to be construed to cover all equivalent structures which fall within the true scope and spirit of the invention.

What is claimed is:

1. A phase-locked loop circuit comprising: a voltage control oscillating means for varying its oscillating frequency in response to a certain control signal; a first logic means for generating pulses having pulse widths proportional to the phase differences between applied input pulses and the pulses from said oscillating means; means for filtering the output of said first logic means; a second and a third logic means for generating a high d.c. level signal and a low d.c. level signal, respectively; means for synthesizing the outputs of said second and third logic means to convert them into a predetermined d.c. level signal; and means for generating said control signal corresponding to the level difference between the outputs of said filtering means and said synthesizing means.

2. A phase-locked loop circuit of claim 1 wherein said second and third logic means are substantially identical logic circuits.

3. A phase-locked loop circuit comprising: a voltage-controlled oscillating means for varying its oscillating frequency in response to a certain control signal; a first logic means for generating pulses having pulse width proportional to the phase difference between applied input pulses and the output of said oscillating means; means for filtering the output of said first logic means; a second logic means for providing a high d.c. level signal and a low d.c. level signal; means for combining said high and low d.c. levels into a predetermined synthesized d.c. level signal; and means for generating said control signal corresponding to the level difference between the outputs of said filtering means and said combining means.

4. A phase-locked loop circuit of claim 3 wherein said first and second logic means are substantially identical logic circuits.

* * * * *